(12) United States Patent
Gao et al.

(10) Patent No.: US 12,256,526 B2
(45) Date of Patent: Mar. 18, 2025

(54) SHIELDING CASE, CIRCUIT BOARD ASSEMBLY, AND ELECTRONIC DEVICE (71) Applicant: Honor Device Co., Ltd., Shenzhen (CN)

(72) Inventors: Jiuliang Gao, Shenzhen (CN); Yihe Zhang, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 17/909,300

(22) PCT Filed: Apr. 26, 2022

(86) PCT No.: PCT/CN2022/089348
§ 371 (c)(1),
(2) Date: Sep. 2, 2022

(87) PCT Pub. No.: WO2023/015953
PCT Pub. Date: Feb. 16, 2023

(65) Prior Publication Data
US 2024/0206138 A1 Jun. 20, 2024

(30) Foreign Application Priority Data

Aug. 12, 2021 (CN) .......................... 202110925358.5

(51) Int. Cl.
*H05K 9/00* (2006.01)
*H05K 1/18* (2006.01)

(52) U.S. Cl.
CPC ............. *H05K 9/0032* (2013.01); *H05K 1/18* (2013.01); *H05K 2201/10159* (2013.01); *H05K 2201/10371* (2013.01); *H05K 2201/10515* (2013.01)

(58) Field of Classification Search
CPC .. H05K 9/0032; H05K 9/0026; H05K 9/0081; H05K 1/181; H05K 2201/10371; H05K 1/0216; H05K 2201/0707; H05K 9/0024; H05K 9/0052; G06F 1/182
See application file for complete search history.

(56) References Cited

U.S. PATENT DOCUMENTS

| 6,181,002 B1* | 1/2001 | Juso .................... H01L 23/3128 257/784 |
| 10,172,265 B2 | 1/2019 | Wrona et al. |
| 2007/0139904 A1 | 6/2007 | English et al. |

(Continued)

FOREIGN PATENT DOCUMENTS

| CN | 102892280 A | 1/2013 |
| CN | 103379812 A | 10/2013 |

(Continued)

*Primary Examiner* — Mandeep S Buttar
(74) *Attorney, Agent, or Firm* — Slater Matsil, LLP (57) ABSTRACT

A shielding case includes a case body. The case body and the circuit board enclose a shielded region, and at least part of elements on the circuit board are capped inside the shielding case. The elements located inside the case body include a first component, where the first component has a step surface facing the case body. A reinforcing part is provided in a region on the case body corresponding to the step surface of the first component, where at least partial structure of the reinforcing part is located in a region on the case body facing to the step surface.

18 Claims, 6 Drawing Sheets

(56) References Cited

U.S. PATENT DOCUMENTS

| | | | |
|---|---|---|---|
| 2007/0210082 A1* | 9/2007 | English | H05K 9/0032 220/4.21 |
| 2009/0244876 A1* | 10/2009 | Li | H05K 9/0032 361/818 |
| 2013/0033843 A1* | 2/2013 | Crotty, Jr. | H05K 9/0032 414/800 |
| 2014/0063774 A1 | 3/2014 | Samuels et al. | |
| 2014/0262473 A1* | 9/2014 | Robinson | H05K 1/181 174/372 |
| 2017/0251549 A1* | 8/2017 | Lee | H05K 7/20454 |
| 2018/0228065 A1 | 8/2018 | Wrona et al. | |
| 2020/0053919 A1 | 2/2020 | Lee et al. | |
| 2020/0093040 A1* | 3/2020 | Yun | H05K 9/0032 |
| 2021/0219470 A1* | 7/2021 | Lee | H05K 9/0037 |
| 2021/0227688 A1 | 7/2021 | Shi | |

FOREIGN PATENT DOCUMENTS

| | | |
|---|---|---|
| CN | 104427841 A | 3/2015 |
| CN | 106793675 A | 5/2017 |
| CN | 107787176 A | 3/2018 |
| CN | 107948348 A | 4/2018 |
| CN | 108112227 A | 6/2018 |
| CN | 207588930 U | 7/2018 |
| CN | 110337230 A | 10/2019 |
| CN | 110446406 A | 11/2019 |
| CN | 112888283 A | 6/2021 |
| CN | 113747776 A | 12/2021 |
| JP | 2010080854 A | 4/2010 |
| WO | 2019023855 A1 | 2/2019 |
| WO | 2021150041 A1 | 7/2021 |

\* cited by examiner

SHIELDING CASE, CIRCUIT BOARD ASSEMBLY, AND ELECTRONIC DEVICE

CROSS-REFERENCE TO RELATED APPLICATIONS

This application is a National Stage of International Application No. PCT/CN2022/089348, filed on Apr. 26, 2022, which claims priority to Chinese Patent Application No. 202110925358.5, filed on Aug. 12, 2021. Both of the aforementioned applications are hereby incorporated by reference in their entireties.

TECHNICAL FIELD

This application relates to the field of electromagnetic shielding technologies, and in particular, to a shielding case, a circuit board assembly, and an electronic device.

BACKGROUND

Currently, terminal devices such as cellular phones, tablet computers, laptop computers, and personal digital assistants (Personal Digital Assistant, PDA) are usually provided with a shielding case that is used to block electromagnetic wave signals.

Using a circuit board as an example, a shielding case installed on the circuit board includes a support frame and a case body, where the support frame is fastened to the circuit board, elements on the circuit board are located in a region enclosed by the support frame, the case body fits outside the support bracket, and the elements are completely wrapped inside the case body, so as to form a complete shielded structure.

However, in a region with compact space where elements are densely distributed, the case body is prone to collapse, threatening the reliability of the shielding case.

SUMMARY

This application provides a shielding case, a circuit board assembly, and an electronic device, where the shielding case provides good support, high strength, and good reliability, and can save layout space for elements on a circuit board, improving space utilization of the circuit board.

According to a first aspect, this application provides a shielding case installed on a side surface of a circuit board on which elements are provided, including a case body, where the case body is provided on the circuit board, the case body and the circuit board enclose a shielded region, and at least part of the elements are located in the shielded region; and the elements in the shielded region include at least one first component, and the first component includes a step surface facing the case body; where a reinforcing part is provided on the case body, and the reinforcing part is at least partly located in a region on the case body directly opposite the step surface.

The shielding case provided in this application includes the case body, where the case body and the circuit board enclose the shielded region, and at least part of the elements on the circuit board are capped inside the shielding case. The elements located inside the case body include a first component, where the first component has a step surface facing the case body, and a usable space is formed between the step surface of the first component and the region on the case body directly opposite the step surface. With the reinforcing part provided in a region on the case body corresponding to the step surface of the first component, at least partial structure of the reinforcing part is located in the region on the case body directly opposite the step surface, so that the usable space formed above the step surface of the first component can be utilized. The reinforcing part is added to increase strength of the case body, preventing a region on the case body around a site corresponding to the step surface from collapsing, and improving stability and reliability of the shielding case. In addition, a gap between the first component and an adjacent element may remain unchanged or have a smaller increase, so that a layout structure with dense arrangement is kept on the circuit board, saving element layout area of the circuit board, and improving space utilization of the circuit board.

In a possible implementation, the case body includes a support bracket and a cover plate, where the support bracket provides support on the circuit board and the cover plate caps the support bracket.

As a support base for the case body, the support bracket is installed on the circuit board to form a supporting skeleton. With the cover plate capping the support bracket, the cover plate and the circuit board together enclose a shielded region, and the elements are capped inside the case body.

In a possible implementation, the support bracket includes a frame body and at least one support plate, where the frame body is provided around an edge of the shielded region, the support plate fits inside the frame body, and the support plate forms the reinforcing part.

With the support plate fitting inside the frame body, the support plate is able to support a corresponding part of the cover plate to prevent partial region of the cover plate from collapsing, improving stability of the cover plate and guaranteeing reliability of the shielding case.

In addition, with the support plate provided in a space between the step surface of the first component and a region on the cover plate directly opposite the step surface, the support plate supports the corresponding part of the cover plate to prevent a region on the cover plate around the support plate from collapsing, improving stability of the cover plate, and enhancing reliability of the shielding case.

In a possible implementation, a recession is provided on the cover plate, where the recession extends towards the step surface and forms the reinforcing part.

With the recession provided in the cover plate as the reinforcing part, the recession in the cover plate exerts on a region around the recession a force opposite to a gravity direction of the cover plate, supporting the region around the recession on the cover plate, thereby preventing the region around the recession from collapsing, improving strength and stability of the cover plate, and enhancing reliability of the case body.

In a possible implementation, in an extension direction of a board surface of the circuit board, a gap is present between the reinforcing part and a surface of the first component close to the case body.

With the reinforcing part located above the step surface of the first component and on a lateral side of an upper part of the first component, and the gap present between the upper part of the first component and the reinforcing part in a horizontal direction, interference between the reinforcing part and the first component can be avoided, which ensures that the shielding case is installed properly without affecting performance of the first component.

In a possible implementation, the reinforcing part extends in a length direction of the step surface and covers at least an edge of the first component.

With the reinforcing part extending in the length direction of the step surface of the first component, utilization of a space between the step surface of the first component and the cover plate is improved, a length of the reinforcing part is extended, a supporting force of the reinforcing part to the case body is increased, and strength and stability of the case body is improved.

In a possible implementation, a projection of the reinforcing part on the circuit board is partly located in a region covered by the step surface.

With the projection of the reinforcing part on the circuit board being partly located in the region covered by the step surface, that is, a widthwise region of the reinforcing part being partly located above the step surface and partly extending to a lateral side of the first component, a width of the reinforcing part is increased, an area of the reinforcing part is expanded, and a force of the reinforcing part acting on the shielding case is increased.

In a possible implementation, in a width direction of the step surface, thickness of an element provided adjacent to the first component is less than thickness of the first component; and the projection of the reinforcing part on the circuit board is partly located in a region covered by the element adjacent to the first component.

With the projection of the reinforcing part on the circuit board being partly located in a region covered by the element on a lateral side of the first component, that is, the reinforcing part extending from a space above the step surface of the first component to a space above the element on the lateral side of the first component, the overage area of the reinforcing part is expanded, a supporting force of the reinforcing part to the case body is increased, and stability and reliability of the case body is improved.

In a possible implementation, the frame body of the support bracket includes a side wall, a fastening edge, and a lapping edge, where the side wall provides support on the circuit board, the fastening edge and the lapping edge are located on two ends of the side wall respectively, the fastening edge is attached onto the circuit board, and the lapping edge is attached onto the cover plate.

The support bracket provides support on the circuit board via the side wall of the frame body. With the provision of the fastening edge attached onto the circuit board at an end of the side wall facing the circuit board, the fastening edge can increase a contact area between the frame body and the circuit board, ensuring that the support bracket is firmly installed. With the provision of the lapping edge attached onto the cover plate at an end of the side wall facing the cover plate, the lapping edge can increase a contact area between the frame body and the cover plate, ensuring that the support bracket is firmly connected to the cover plate.

In a possible implementation, the fastening edge is located outside a region enclosed by the side wall, the lapping edge is located inside the region enclosed by the side wall, and the support plate is connected to the lapping edge.

With the fastening edge attached onto the circuit board being provided outside the side wall, the fastening edge does not occupy space inside the shielding case, and the gap between the side wall and a peripheral element inside the shielding case is reduced, thereby reducing spatial volume of the support bracket and reducing space occupied by a shielding frame. With the lapping edge attached onto the cover plate being provided inside the side wall, the lapping edge does not occupy additional peripheral space of the side wall and space occupied by the support bracket is reduced, thereby reducing the space occupied by the shielding frame. In addition, the edge of the cover plate can extend to the side wall of the frame body along the lapping edge, expanding a connection area between the support bracket and the cover plate, and improving connection strength between the support bracket and the cover plate.

In a possible implementation, the cover plate includes a plate body, at least part of an outer edge of the plate body extending beyond a side edge that is attached onto the side wall.

With the side edge provided in at least part of the outer edge of the plate body, an edge part of the plate body of the cover plate is attached onto the lapping edge of the frame body, the side edge of the cover plate is attached onto the side wall of the frame body, and the edge part of the plate body of the cover plate and the side edge of the cover plate can be connected to the lapping edge of the frame body and the side wall of the frame body respectively, increasing a connection area between the cover plate and the support bracket, and improving connection strength between the cover plate and the support bracket.

According to a second aspect, this application provides a circuit board assembly, including a circuit board and the foregoing shielding case, where a plurality of elements are provided on a side surface of the circuit board, and the shielding case caps at least part of the elements.

The circuit board assembly provided in this application includes the circuit board and the shielding case, where a plurality of elements are provided on an element surface of the circuit board, the shielding case includes a case body, the case body and the element surface of the circuit board enclose a shielded region, and at least part of the elements on the circuit board are capped inside the shielding case. The elements located inside the case body include a first component, where the first component has a step surface facing the case body, and a usable space is formed between the step surface of the first component and a region on the case body directly opposite the step surface. With a reinforcing part provided in a region on the case body corresponding to the step surface of the first component, at least partial structure of the reinforcing part is located in the region on the case body directly opposite the step surface, so that the usable space formed above the step surface of the first component can be utilized. The reinforcing part is added to increase strength of the case body, preventing a region on the case body around a site corresponding to the step surface from collapsing, and improving stability and reliability of the shielding case. In addition, a gap between the first component and an adjacent element may remain unchanged or have a smaller increase, so that a layout structure with dense arrangement is kept on the circuit board, saving element layout area of the circuit board, and improving space utilization of the circuit board.

According to a third aspect, this application provides an electronic device, including at least one circuit board assembly described above.

The electronic device provided in this application includes a circuit board assembly, where the circuit board assembly includes a circuit board and a shielding case, a plurality of elements are provided on an element surface of the circuit board, the shielding case includes a case body, the case body and the element surface of the circuit board enclose a shielded region, and at least part of the elements on the circuit board are capped inside the shielding case. The elements located inside the case body include a first component, where the first component has a step surface facing the case body, and a usable space is formed between the step surface of the first component and a region on the case body directly opposite the step surface. With a reinforcing part provided in a region on the case body corresponding to the step surface of the first component, at least partial structure of the reinforcing part is located in the region on the case body directly opposite the step surface, so that the usable space formed above the step surface of the first component can be utilized. The reinforcing part is added to increase strength of the case body, preventing a region on the case body around a site corresponding to the step surface from collapsing, and improving stability and reliability of the shielding case. In addition, a gap between the first component and an adjacent element may remain unchanged or have a smaller increase, so that a layout structure with dense arrangement is kept on the circuit board, saving element layout area of the circuit board, and improving space utilization of the circuit board.

REFERENCE SIGNS ARE DESCRIBED AS FOLLOWS 100. circuit board assembly;
1. shielding case; 2. circuit board; 3. element;
101: support frame; 1011. support beam; 102: shielding cover; 301. first element; 302. second element;
10. case body; 10a: reinforcing part; 11. support bracket; 12. cover plate; 21. element surface; 22. positioning hole; 31. first component;
111. frame body; 112. support plate; 121. plate body; 122. side edge; 311. step surface; 1111. side wall; 1112. fastening edge; 1113. lapping edge; 1121. supporting part; 1211. recession; 1221. protrusion;
1111a. pit; 1112a. mounting hole.

DETAILED DESCRIPTION OF ILLUSTRATIVE EMBODIMENTS

Terms in the embodiments of this application are merely intended to describe specific embodiments of this application, and are not intended to limit this application.

In order to improve sensitivity, anti-interference, and other performance of electronic devices especially portable mobile electronic devices, a shielding case is typically required to block sensitive signals or interference sources. The shielding case can stop outside electromagnetic waves from interfering with circuits inside the shielding case, and prevent electromagnetic waves generated inside the shielding case from radiating to the outside.

Taking a mobile phone as an example, a circuit board inside the mobile phone is typically provided with a shielding case, and elements on the circuit board are capped inside the shielding case, so that the elements inside the shielding case are prevented from interfering with other components inside the mobile phone.

Figure 1:
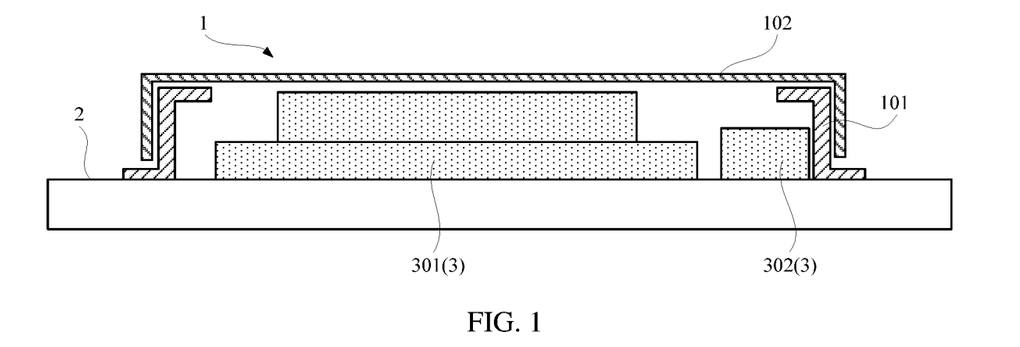
FIG. 1 is a schematic structural diagram of a shielding case being provided on a circuit board according to the related art.
Figure 2:
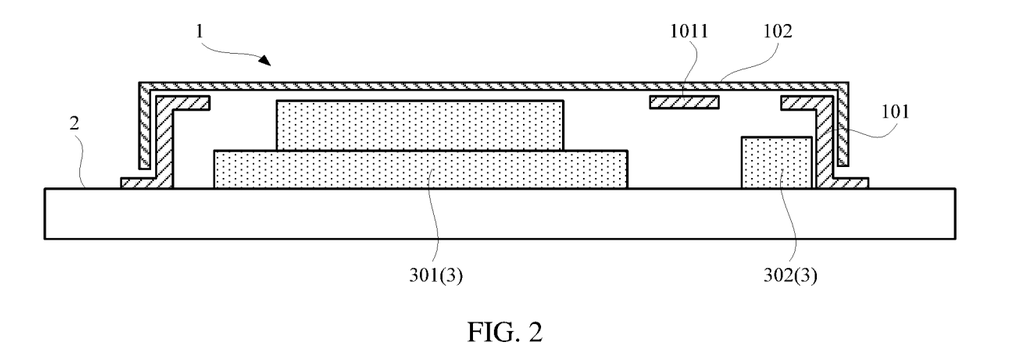
FIG. 2 is another schematic structural diagram of a shielding case being provided on a circuit board according to the related art.

FIG. 1 is a schematic structural diagram of a shielding case being provided on a circuit board according to the related art, and FIG. 2 is another schematic structural diagram of a shielding case being provided on a circuit board according to the related art.

Referring to FIG. 1 and FIG. 2, a shielding case 1 typically includes a support frame 101 and a shielding cover 102, where the support frame 101 is fastened to a circuit board 2. The support frame 101 is typically an annular frame body surrounding elements 3 on the circuit board 2. The support frame 101 forms a support base, and the shielding cover 102 fits outside the support frame 101. The shielding cover 102 and the support frame 101 form a complete enclosing structure that completely shields the elements 3 located within an enclosed region of the support frame 101.

In actual application, more elements 3 are provided on the circuit board 2. In this case, more elements 3 are included in the shielding case 1, a span of the shielding cover 102 is large, the entire shielding cover 102 cannot be supported by relying merely on the support frame 101 located on an outer edge of the enclosed region, which may lead to deformation and collapse in a partial region of the shielding cover 102. For example, a collapse toward the circuit board 2 in a central region of the shielding cover 102 undermines stability of the shielding case 1. If a case body is in contact with the elements 3 inside, performance of the shielding case 1 and working performance of the elements 3 may be affected.

Therefore, in the shielding cover 1 with the large span, the support frame 101 typically further fits with a support beam 1011, where the support beam 1011 is located in an opening region of the support frame 101, and the support beam 1011 provides support under the shielding cover 102. The support beam 1011 provides support to the shielding cover 102, so that stability of the shielding cover 102 is improved, and partial collapse of the shielding cover 102 is avoided. A plurality of support beams 1011 may fit in the support frame 101, and the plurality of support beams 1011 may be distributed in different parts, so that different parts of the shielding cover 102 can be supported by the plurality of support beams 1011, ensuring stability of the shielding cover 102 with the large span.

However, the circuit board 2 that is provided with a relatively large number of elements 3 may have a dense layout region on which the elements 3 are concentrated and a layout space is compact (hereinafter referred to as "dense layout region"). Due to the large number and dense layout of the elements 3 in the dense layout region, especially due to limited height space within the shielding case 1, it is generally difficult to install the support beam 1011 in the region, and a region of the shielding cover 102 corresponding to this region cannot be effectively supported.

Referring to FIG. 1, FIG. 1 is a schematic structural diagram of the shielding case 1 in a dense layout region according to the related art. Taking a first element 301 and a second element 302 that are adjacent as shown in FIG. 1 as an example, a gap between the first element 301 and the second element 302 is small, thickness of the first element 301 is large, and the first element 301 occupies more height space, resulting in a small gap between the first element 301 and the shielding case 1. Therefore, in order to maintain dense arrangement in this region and ensure compactness of the layout of elements 3 on the circuit board 2, the support beam 1011 is typically not provided in a space between the first element 301 and the second element 302.

Referring to FIG. 2, FIG. 2 is another schematic structural diagram of the shielding case 1 in a dense layout region according to the related art. In order to install the support beam 1011 between the first element 301 and the second element 302, the gap between the first element 301 and the second element 302 is increased, a space for the support beam 1011 between the first element 301 and the second element 302 is reserved, the support beam 1011 on the support frame 101 is provided in the space between the first element 301 and the second element 302, and the support beam 1011 supports a part of the shielding cover 102 that is located between the first element 301 and the second element 302.

The gap maintained between the first element 301 and the second element 302 as shown in FIG. 1 keeps a compact layout on the circuit board 2. However, because the support beam 1011 is not provided in the dense layout region, a region of the shielding cover 102 located in the dense layout region is prone to deformation and collapse, the shielding cover 102 is not stable, undermining reliability of the shielding case 1, and affecting performance of the shielding case 1 and working performance of the elements 3 in the shielding case 1.

As shown in FIG. 2, a sufficient space is reserved between the first element 301 and the second element 302 and the support beam 1011 is provided in the space. The support of the support beam 1011 to the shielding cover 102 improves stability of the shielding cover 102, avoids partial collapse of the shielding cover 102, and ensures reliability of the shielding cover 1. However, due to an increase in the gap between the first element 301 and the second element 302, a layout area for the elements 3 is increased, resulting in a waste of the layout area on the circuit board 2, and reducing utilization of layout of the circuit board 2. In addition, due to the increase in the layout area for the elements 3, an area capped by the shielding case 1 increases, increasing volume of the shielding case 1, increasing space occupied by shielding case 1, incurring high costs, and correspondingly reducing layout space of other components in an electronic device, affecting a sound layout in the electronic device.

In response to this, an embodiment of this application provides an electronic device, the electronic device may be a mobile terminal device such as a mobile phone, a tablet computer, a laptop computer, a personal digital assistant (Personal Digital Assistant, PDA), a smart wearable device, or a point of sales (Point of Sales, POS). Alternatively, the electronic device may be a fixed terminal device such as a smart television, a server, or a switch. This is not limited in this embodiment.

Figure 3:
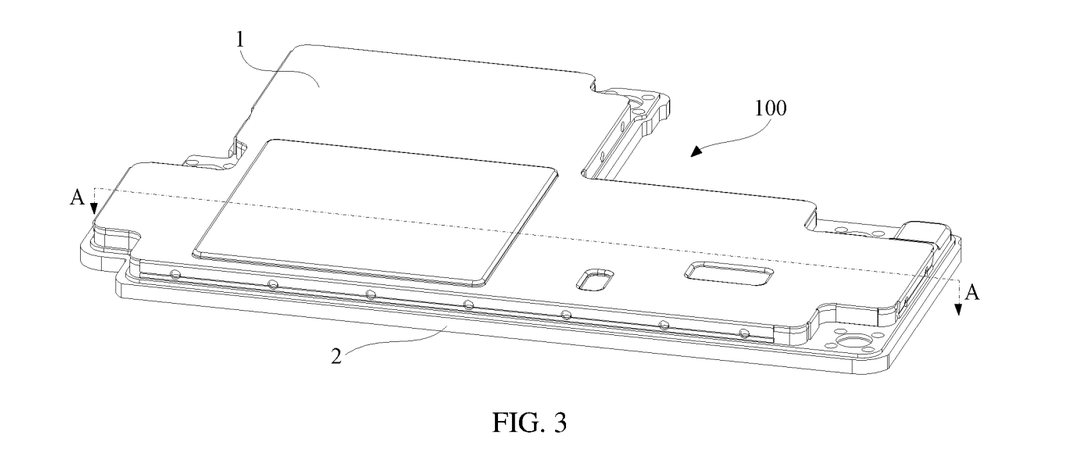
FIG. 3 is a schematic structural diagram of a circuit board assembly according to an embodiment of this application.
Figure 4:
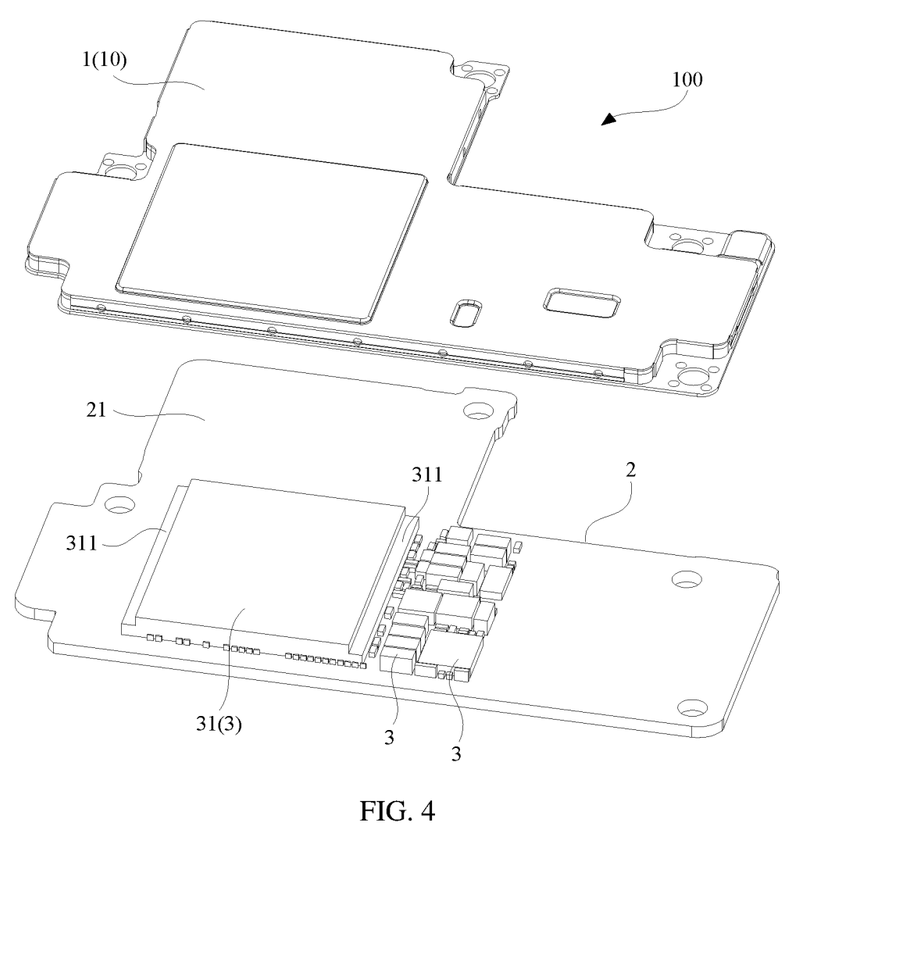
FIG. 4 is an exploded view of FIG. 3.

FIG. 3 is a schematic structural diagram of a circuit board assembly according to an embodiment of this application. FIG. 4 is an exploded view of FIG. 3.

Referring to FIG. 3, an electronic device such as a mobile phone is provided with a circuit board assembly 100, where the circuit board assembly 100 includes a circuit board 2 and a shielding case 1.

Referring to FIG. 4, a plurality of elements 3 are provided on the circuit board 2, and all the elements 3 can be provided on a same side surface of the circuit board 2. One side surface of the circuit board 2 on which the elements 3 are provided may be defined as an element surface 21 of the circuit board 2, and the circuit board 2 may be firmly installed in the electronic device through the other side surface. Taking a printed circuit board 2 (Printed Circuit Board, PCB) as an example, one side surface of the PCB is the element surface 21 that lays out the elements 3, printed wires are typically placed on the other side surface of the PCB for soldering, and such side surface can be referred to as a printed surface.

Alternatively, each side surface of the circuit board 2 can be provided with the elements 3, so that each side surface of the circuit board 2 is used as an element surface 21. This is not limited in this embodiment.

For example, the circuit board 2 may be a main board in a mobile phone, the circuit board 2 is provided with a chip such as a central processing unit (Central Processing Unit, CPU), a double data rate (Double Data Rate, DDR) memory, an electrically erasable programmable read-only memory (Electrically Erasable Programmable Read-Only Memory, EEPROM), or a power management device, and the circuit board 2 may be further provided with a capacitor, a resistor, a connector, or other elements 3.

Still referring to FIG. 4, the shielding case 1 is provided on the element surface 21 of the circuit board 2, at least part of the elements 3 on the element surface 21 of the circuit board 2 are capped inside the shielding case 1, so that the elements 3 located inside the shielding case 1 can be prevented from electromagnetically interfering with other outside components, and the other components outside the shielding case 1 can be prevented from affecting performance of the elements 3 inside the shielding case 1. In addition, the shielding case 1 forms a protective barrier for the elements 3 inside the shielding case 1, preventing other outside components from affecting stability of the elements 3 inside the shielding case 1.

For example, all the elements 3 on the element surface 21 of the circuit board 2 may be located inside the shielding case 1. A shielding case 1 can be provided on the element surface 21 of the circuit board 2, with all the elements 3 capped inside the shielding case 1. Alternatively, in a case that an area on the element surface 21 of the circuit board 2 for arrangement of elements 3 is large and there are many elements 3 being arranged, a plurality of shielding cases 1 can be provided in different regions on the circuit board 2, so that the elements 3 in each region can be capped by each shielding case 1.

The following describes the circuit board 2 in detail.

Figure 5:
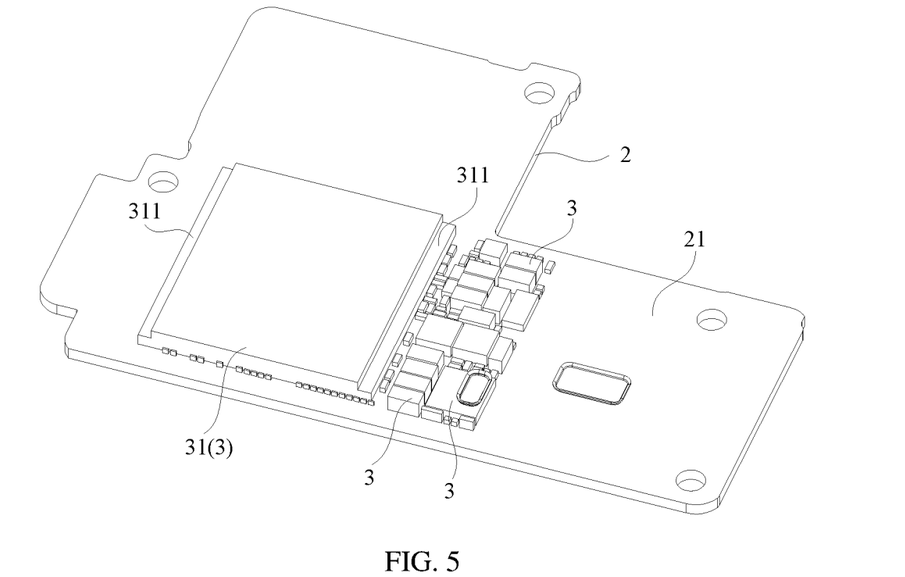
FIG. 5 is a schematic structural diagram of a circuit board according to an embodiment of this application.

FIG. 5 is a schematic structural diagram of a circuit board according to an embodiment of this application. Referring to FIG. 5, in actual application, in order to effectively utilize layout space on the circuit board 2 and improve utilization of layout of the circuit board 2, some chips may be stacked on the circuit board 2 in a stacking manner. For example, the chips are provided on the element surface 21 of the circuit board 2 in their thickness direction, and are provided on the circuit board 2 as a stacked chipset. For some chips with larger sizes, at least two chips are typically stacked as a stacked chipset to save space occupied by the chips. In addition, impedance of a circuit may also be reduced.

For example, taking a CPU chip and a DDR chip as an example, because sizes of the DDR chip and the CPU chip are large and a planar size of the DDR chip is typically smaller than that of the CPU chip, in a layout design of the circuit board 2, the DDR chip is typically stacked on the CPU chip to form a stacked chipset.

The DDR chip and the CPU chip are stacked, so that the DDR chip is located in a coverage area of the CPU chip on the circuit board 2, and the DDR chip does not occupy an extra layout area on the circuit board 2, saving the layout space of the circuit board 2, and improving utilization of layout of the circuit board 2. In addition, a length of a wire that connects the DDR chip and the CPU chip is shortened, saving space occupied by the wire, and reducing impedance of a circuit formed between the DDR chip and the CPU chip.

It may be understood that if the DDR chip and the CPU chip are provided side by side on the circuit board 2, and the DDR chip and the CPU chip are connected via a wire, one side of the DDR chip and one side of the CPU chip that are facing and approaching each other may be connected via a wire, and the other side of the DDR chip and the other side of the CPU chip that are leaving each other may be connected via a wire. Alternatively, a side of the DDR chip and a side of the CPU chip that are in a same direction are connected via a wire. Further alternatively, the DDR chip and the CPU chip are connected to each other in other manners.

It is clear that a long wire is needed to connect the DDR chip and the CPU chip when they are provided side by side and are connected via a wire. Therefore, the impedance generated in the circuit formed between the DDR chip and the CPU chip is also large. In this regard, with the DDR chip being stacked on the CPU chip, same sides of the DDR chip and the CPU chip in a thickness direction may be connected via a wire, largely shortening the length of the wire connected between the DDR chip and the CPU chip, and effectively reducing the impedance of the circuit formed between the DDR chip and the CPU chip.

In the layout design of the elements 3 on the circuit board 2, in addition to the stacking of the DDR chip and the CPU chip, other chips can also be stacked to form a stacked chipset. For example, an EEPROM chip and a CPU chip are stacked, an EEPROM chip and a DDR chip are stacked, or an EEPROM chip, a DDR chip, and a CPU chip are stacked together. This is not specifically limited in this embodiment. The stacking is similar to the foregoing stacking of the DDR chip and the CPU chip. With different chips being stacked, the layout space of the circuit board 2 is saved, utilization of layout of the circuit board 2 is improved, and impedance of a circuit is reduced. Details are not described again.

In actual application, a chip with a small planar size is typically stacked on a chip with a large planar size to ensure stability of the stacked chips, so that the chip on top can be fastened on the chip on bottom. In this way, in a stacked chipset, a chip located on top and a chip located on bottom form a step surface 311. Because the chip on top has a small planar size, the step surface 311 is a surface on the chip on bottom that is exposed outside the chip on top, and the step surface 311 is facing away from the element surface 21 of the circuit board 2.

In addition, in some other scenarios, the circuit board 2 is provided with some elements 3 with special shapes. For example, an outer contour of the element 3 with a special shape may be similar to an outer contour of the foregoing stacked chipset, that is, the element 3 with a special shape has a width difference between an upper part and a lower part in its thickness direction, where a width of the upper part of the element 3 is smaller and a width of the lower part of the element 3 is larger. For example, in a side view direction of the element surface 21 of the circuit board 2, the outer contour of the element 3 with a special shape is umbonate, that is, a longitudinal cross-section of the element 3 with a special shape is umbonate. Similar to a stacked chipset, an element 3 with a special shape has a step surface 311, where the step surface 311 is facing away from the element surface 21 of the circuit board 2.

For example, the element 3 with the special shape may be a capacitor, a resistor, a connector, or other electronic elements 3.

For ease of description, in this embodiment, the foregoing stacked chipset and the element 3 with a special shape are collectively referred to as first components 31. Therefore a longitudinal cross-section of the first component 31 as shown in FIG. 3 is umbonate. Alternatively, both sides of an outer contour of the first component 31 have a multi-stage step surface 311 that gradually extends toward the element surface 21 of the circuit board 2. For example, the first component 31 is a stacked chipset with at least three layers of chips. In this way, the first component 31 has a step surface 311 that is facing away from the element surface 21 of the circuit board 2.

It may be understood that in many elements 3 provided on the circuit board 2, at least one group of the foregoing stacked chipsets or one element 3 with the special shape is provided, that is, the circuit board 2 has at least one first component 31.

Referring to FIG. 4, in a specific implementation, the first component 31 is, for example, an element 3 with a large planar size. For example, the first component 31 is the foregoing stacked chipset form by the CPU chip and the DDR chip. Alternatively, the first component 31 is the foregoing element 3 with an umbonate longitudinal cross-section and a large planar size. On the element surface 21 of the circuit board 2, a plurality of other elements 3 are provided on a lateral side of the first component 31. For example, as shown in FIG. 3, a plurality of elements 3 with small sizes are spaced apart in a row or column on a lateral side of the first component 31.

In other scenarios, other elements 3 with large planar sizes may be provided on the lateral side of the first component 31 with a large planar size. An element 3 provided adjacent to the first component 31 has no specific limitation in shape, size, and layout in this embodiment. For example, a plurality of chips with small planar sizes may be spaced apart on a side adjacent to the first component 31, where a stacked chipset may be included. Alternatively, a single-layered chip with large planar size may be provided on the side adjacent to the first component 31. Further alternatively, a stacked chipset with a large planar size may be provided on the side adjacent to the first component 31.

In order to make a proper layout structure of the elements 3 on the element surface 21 of the circuit board 2 and efficiently utilize the layout area of the circuit board 2, referring to FIG. 3, the plurality of elements 3 on the lateral side of the first component 31 and the first component 31 are closely arranged, and a gap between the first component 31 and an adjacent element 3 is small. For an element 3 with a large planar size on a side of the first component 31, a gap between the element 3 with a large planar size and the first component 31 is small.

With reference to FIG. 4, in a case that the circuit board 2 is provided with many elements 3, the provided elements 3 include the foregoing first component 31, layout of the first component 31 and its surrounding elements 3 is compact, and the layout space on the circuit board 2 is insufficient, especially for the first component 31 with the large planar size, in this embodiment, the shielding case 1 is designed for utilizing the space between the step surface 311 of the first component 31 and the shielding case 1, and a reinforcing part 10a is provided on the shielding case 1 to improve strength of the shielding case 1, avoiding partial collapse of the shielding case 1, and enhancing reliability of the shielding case 1. In addition, the gap between the first component 31 and the element 3 on the side of the first component 31 may remain unchanged or have a smaller increase, so as to keep the elements 3 compactly arranged, saving the layout space on the circuit board 2, reducing an area for laying out the elements 3, and improving space utilization of the circuit board 2.

The following describes the shielding case 1 in detail with reference to the circuit board 2.

Figure 6:
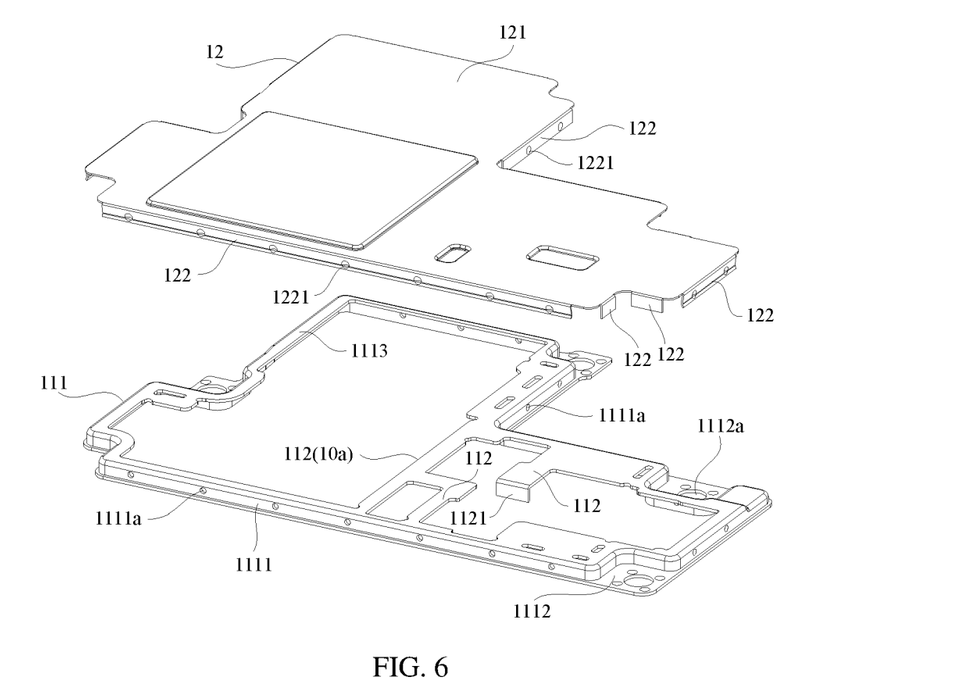
FIG. 6 is a schematic structural diagram of a shielding case according to an embodiment of this application.
Figure 7:
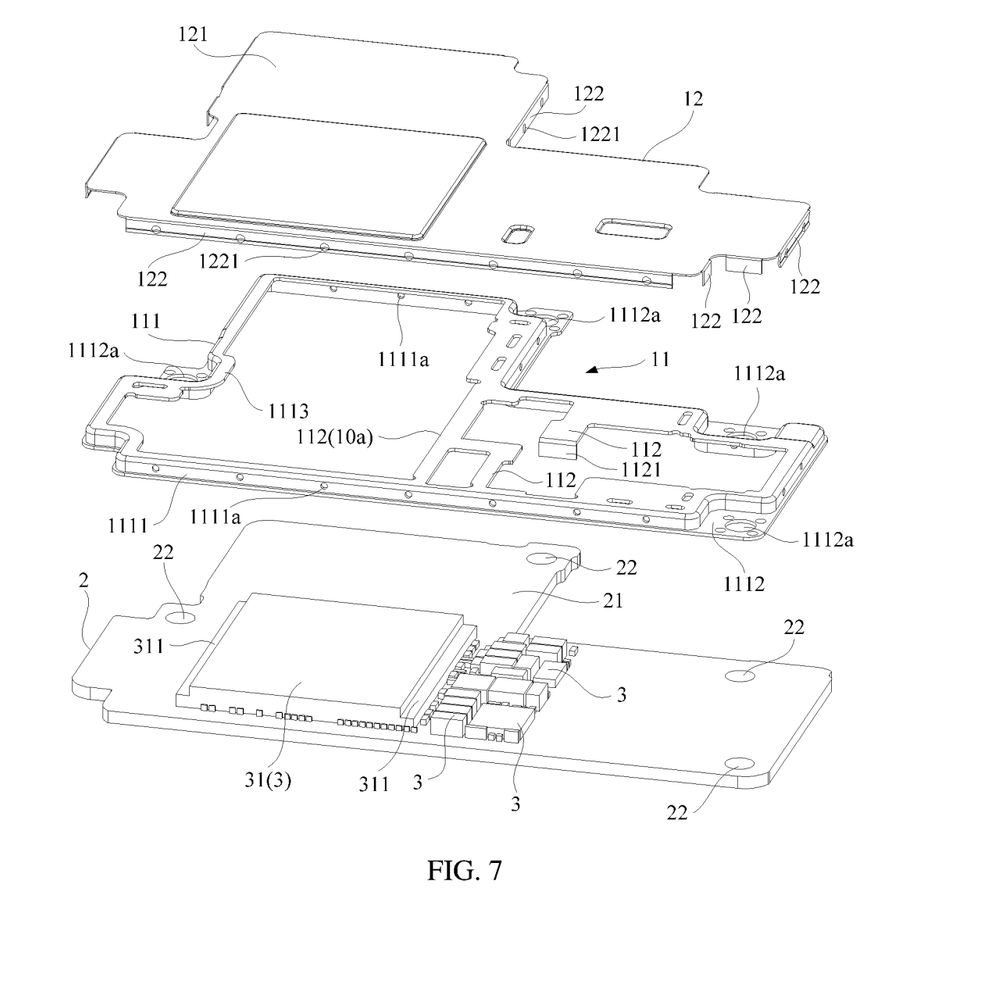
FIG. 7 is an exploded view of a circuit board assembly according to an embodiment of this application.
Figure 8:
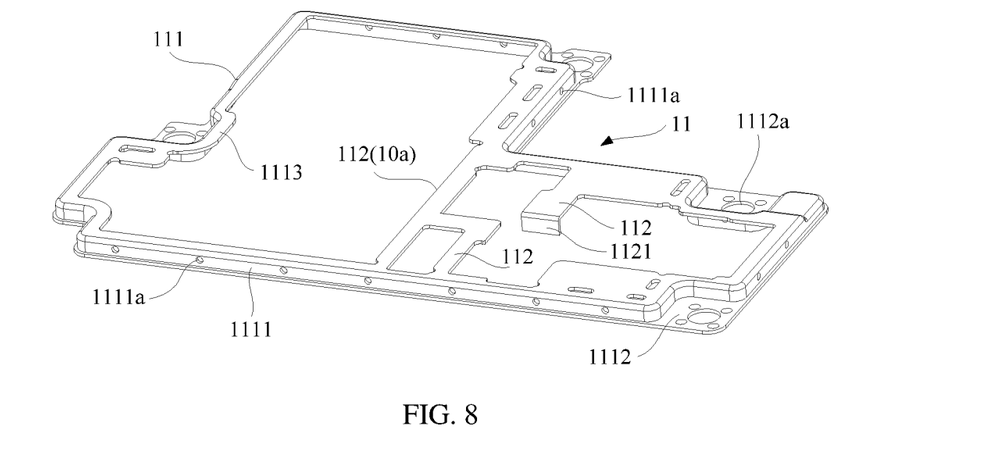
FIG. 8 is a schematic structural diagram of a support bracket according to an embodiment of this application.
Figure 9:
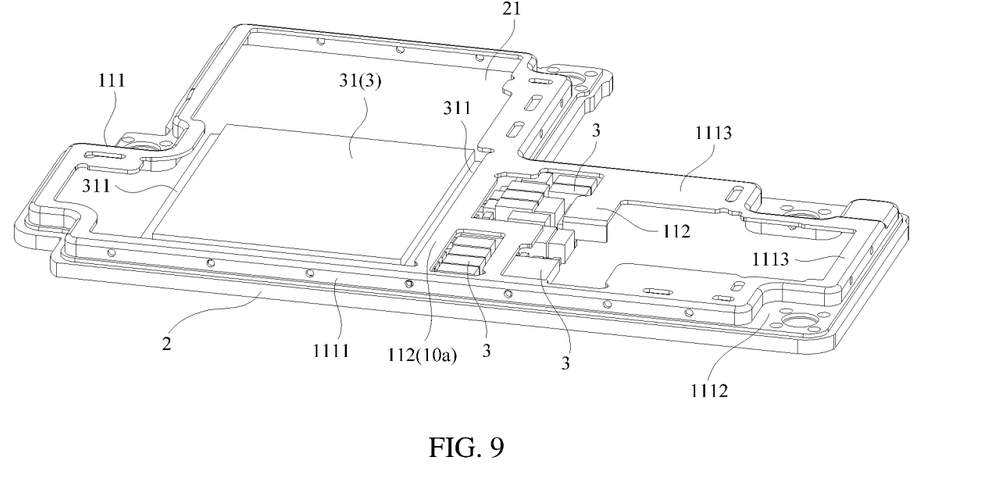
FIG. 9 is a schematic structural diagram of a support bracket being installed on a circuit board according to an embodiment of this application.

FIG. 6 is a schematic structural diagram of a shielding case according to an embodiment of this application; FIG. 7 is an exploded view of a circuit board assembly according to an embodiment of this application; FIG. 8 is a schematic structural diagram of a support bracket according to an embodiment of this application; and FIG. 9 is a schematic structural diagram of a support bracket being installed on a circuit board according to an embodiment of this application.

With reference to FIG. 4, the shielding case 1 includes a case body 10, where the case body 10 is provided on the element surface 21 of the circuit board 2, the case body 10 is a semi-enclosed structure, a side of the case body 10 facing the element surface 21 of the circuit board 2 is open, the case body 10 caps the element surface 21 of the circuit board 2, and the case body 10 and the element surface 21 of the circuit board 2 encloses a shielded region. The case body 10 is a metal member, so that the shielding case 1 can shield signals. For example, the case body 10 may be made of nickel silver or iron.

In a specific implementation, an outer contour of the case body 10 shown in FIG. 4 matches an outer contour of the circuit board 2. For example, an edge of the case body 10 may be flush with an edge of the circuit board 2, and the case body 10 caps all the elements 3 on the element surface 21 of the circuit board 2. In another implementation, the case body 10 may only cap part of the elements 3 on the circuit board 2. For example, the case body 10 caps the first component 31 and part of the elements 3 that are densely arranged around the first component 31.

In a case that the first component 31 has great thickness, for example, the first component 31 is the foregoing stacked chipset, after a plurality of chips are stacked, the thickness of the first component 31 is increased. A vertical gap between a surface of the first component 31 and the case body 10 is small, and there is usually no enough space to provide a supporting structure in a region in which the surface of the first component 31 is directly opposite the case body 10, resulting in low strength in this region of the case body 10. In addition, because other elements 3 are densely arranged around the first component 31, space of this region in the case body 10 is insufficient, which is difficult to provide a supporting structure, and a hollow region on the case body 10 is large, which is not stable.

For the first component 31 with a large planar size, an area of the case body 10 directly above the first component 31 is large. Because other elements 3 are provided around the first component 31, an area of the dense layout region on the circuit board 2 is large, and accordingly, the hollow region on the case body 10 increases. As a result, the case body 10 in this region is prone to collapse, which undermines reliability of the case body 10.

It should be understood that the surface of the first component 31 is a surface of the first component 31 exposed to the element surface 21 of the circuit board 2. The vertical gap between the surface of the first component 31 and the case body 10 is a gap, in a thickness direction of the circuit board 2, between the surface of the first component 31 and the region on the case body 10 directly opposite the first component 31.

In order to enhance reliability of the case body 10 and prevent partial collapse of the case body 10, in this embodiment of this application, the space between the step surface 311 of the first component 31 and the region on the case body 10 directly opposite the step surface 311 is utilized to provide a reinforcing part 10a (not shown in the figure) on the case body 10, and at least partial structure of the reinforcing part 10a on the case body 10 is located in a region on the case body 10 directly opposite the step surface 311 of the first component 31. The reinforcing part 10a on the case body 10 improves strength of the case body 10 located in the dense layout region, improves stability of the case body 10, prevents partial collapse of the case body 10, and ensures reliability of the case body 10.

For ease of description, the space between the step surface 311 of the first component 31 and the region on the case body 10 directly opposite the step surface 311 is defined as a usable space. The reinforcing part 10a is provided on the region of the case body 10 corresponding to the usable space, so that the reinforcing part 10a increases strength of the case body 10, and reliability of the case body 10 is ensured by the reinforcing part 10a. In addition, because the reinforcing part 10a utilizes the usable space between the step surface 311 of the first component 31 and the case body 10, a gap between the first component 31 and an adjacent element 3 does not need to be increased or has a smaller increase, so as to keep the elements 3 densely arranged on the circuit board 2, saving the layout area for the elements 3 on the circuit board 2 and improving space utilization of the circuit board 2.

In an implementation, the reinforcing part 10a may be located entirely in the usable space above the step surface 311 of the first component 31. In another implementation, partial structure of the reinforcing part 10a may be located in the usable space above the step surface 311 of the first component 31, and the rest structure of the reinforcing part 10a may be located in a gap between the first component 31 and an adjacent element 3.

Referring to FIG. 6, the case body 10 may include a support bracket 11 and a cover plate 12, where the support bracket 11 may be a frame structure, the cover plate 12 caps the support bracket 11, the support bracket 11 supports the cover plate 12, the cover plate 12 mainly serves as a shielding structure, and the cover plate 12 and the bracket forms the case body 10. Referring to FIG. 7, the support bracket 11 is fastened on the element surface 21 of the circuit board 2, the elements 3 on the circuit board 2 are enclosed inside the support bracket 11, the cover plate 12 caps the support bracket 11, the cover plate 12, the support bracket 11, and the element surface 21 of the circuit board 2 encloses a shielded region, and the elements 3 are shielded inside the case body 10.

In actual application, the support bracket 11 may be welded to the element surface 21 of the circuit board 2 to provide a connection base for the cover plate 12, and the cover plate 12 can be glued or welded to the support bracket 11. For example, because the support bracket 11 is a frame structure, an area for gluing is limited, and both the support bracket 11 and the cover plate 12 are metal members, the cover plate 12 may be welded to the support bracket 11 to ensure that the cover plate 12 is firmly connected to the support bracket 11.

Referring to FIG. 8, the support bracket 11 includes a frame body 111 that is enclosed outside the shielded region, where the frame body 111, as a main structure of the support bracket 11, defines a size of the support bracket 11. A shape and size of the cover plate 12 may match a shape and size of the frame body 111, and an edge part of the cover plate 12 is connected to the frame body 111. For example, the edge part of the cover plate 12 is welded to the frame body 111.

Specifically, the frame body 111 of the support bracket 11 may include a side wall 1111, a fastening edge 1112 and a lapping edge 1113, and the support bracket 11 may be an integrally formed member, that is, the side wall 1111, the fastening edge 1112, and lapping edge 1113 of the frame body 111 are of an integral structure. For example, the side wall 1111, the fastening edge 1112, and the lapping edge 1113 of the frame body 111 can be formed by punching.

Referring to FIG. 9, the side wall 1111 of the frame body 111 provides support on the circuit board 2, and the side wall 1111 of the frame body 111 forms a structure base of the support bracket 11. An extension direction of the side wall 1111 of the frame body 111 is inclined to a plane in which the element surface 21 of the circuit board 2 is located. For example, the side wall 1111 of the frame body 111 extends in a direction perpendicular to the element surface 21 of the circuit board 2, so that the support bracket 11 has a specific height on the circuit board 2 to form a shielded region between the cover plate 12 capping the support bracket 11 and the element surface 21 of the circuit board 2 to enclose the elements 3 inside the shielding case 1.

For example, the side wall 1111 of the frame body 111 is perpendicular to the element surface 21 of the circuit board 2. A height of the side wall 1111 of the support bracket 11 should be greater than that of an element 3 with the largest thickness inside the shielding case 1, so that a gap is present between the cover plate 12 and the element 3 with the largest thickness to prevent the shielding case 1 from being in contact with the element 3, so as to avoid affecting performance of the shielding case 1 and the element 3.

The fastening edge 1112 of the frame body 111 is located at an end of the side wall 1111 facing the element surface 21 of the circuit board 2, the fastening edge 1112 extends along the element surface 21 of the circuit board 2, the fastening edge 1112 is attached onto the element surface 21 of the circuit board 2, and the fastening edge 1112 can increase a contact area between the support bracket 11 and the circuit board 2, improving stability of the support bracket 11. The support bracket 11 is installed on the circuit board 2 by the fastening edge 1112. For example, the fastening edge 1112 of the frame body 111 is welded on the element surface 21 of the circuit board 2, and a large welded area between the fastening edge 1112 and the circuit board 2 may ensure that the support bracket 11 is firmly welded.

In addition, with reference to FIG. 7, on a basis that the fastening edge 1112 of the frame body 111 and the element surface 21 of the circuit board 2 are connected by welding, an mounting hole 1112a may be further provided on the fastening edge 1112 of the frame body 111, a positioning hole 22 may be provided on a part on the circuit board 2 corresponding to the mounting hole 1112a of the frame body 111, connecting members such as screws and rivets may penetrate through the mounting hole 1112a of the frame body 111 and the positioning hole 22 of the circuit board 2, and the support bracket 11 is fastened on the circuit board 2 by the connecting members. Alternatively, the support bracket 11 and the circuit board 2 are fastened to each other by only the connecting members.

The lapping edge 1113 of the frame body 111 is located at an end of the side wall 1111 facing the cover plate 12, and a surface of the cover plate 12 facing the element surface 21 of the circuit board 2 is defined as an inner surface of the cover plate 12, the lapping edge 1113 extends along the inner surface of the cover plate 12, and the lapping edge 1113 is attached onto the inner surface of the cover plate 12. Similar to the fastening edge 1112 of the frame body 111, the lapping edge 1113 attached onto the inner surface of the cover plate 12 is provided on the support bracket 11, so that a contact area between the support bracket 11 and the cover plate 12 may be increased. The lapping edge 1113 of the frame body 111 and the inner surface of the cover plate 12 may be welded together to ensure that the support bracket 11 is firmly welded to the cover plate 12.

Taking the element surface 21 of the circuit board 2 that is vertically supported by the side wall 1111 of the frame body 111 as an example, both the fastening edge 1112 and the lapping edge 1113 located at two ends of the side wall 1111 of the frame body 111 may be perpendicular to the side wall 1111.

Still referring to FIG. 9, the fastening edge 1112 attached onto the element surface 21 of the circuit board 2 may be located outside a region enclosed by the side wall 1111, the fastening edge 1112 does not occupy space of the region enclosed by the side wall 1111, the side wall 1111 may be provided close to a peripheral element 3 inside the side wall 1111. On the premise that to-be-protected elements 3 are all enclosed inside, a spatial volume of the support bracket 11 may be reduced, a size of the shielding frame is reduced, and space occupied by a circuit board assembly 100 is reduced, so that a large layout space can be reserved for other components in the electronic device.

The lapping edge 1113 located at the end of the side wall 1111 facing the cover plate 12 may be located inside the region enclosed by the side wall 1111 to avoid the lapping edge 1113 from occupying additional space on a periphery of the side wall 1111, which reduces the space occupied by the support bracket 11 and the space occupied by the shielding frame, thereby reducing the space occupied by the circuit board assembly 100, and improving the layout design of other components in the electronic device. In addition, the lapping edge 1113 that extends toward the inner side of the side wall 1111 matches an orientation in which the cover plate 12 encloses the support bracket 11, and the area of the side wall 1111 can be utilized to increase the connection area between the support bracket 11 and the cover plate 12, improving connection strength between the support bracket 11 and the cover plate 12.

In order to increase the connection area between the cover plate 12 and the frame body 111, with reference to FIG. 7, an edge of the cover plate 12 may extend along the lapping edge 1113 of the frame body 111 to be attached onto the side wall 1111 of the frame body 111, so as to increase the contact area between the cover plate 12 and the support bracket 11. The cover plate 12, the lapping edge 1113 of the frame body 111, and the side wall 1111 are all connected to each other, improving connection strength between the cover plate 12 and the support bracket 11.

The cover plate 12 includes a plate body 121 and a side edge 122, where the plate body 121 as a whole is parallel to the element surface 21 of the circuit board 2, the side edge 122 is located at an outer edge of the plate body 121, the side edge 122 is attached onto the side wall 1111 of the frame body 111, an edge part of the plate body 121 of the cover plate 12 is attached onto the lapping edge 1113 of the frame body 111, the side edge 122 of the cover plate 12 and the edge part of the plate body 121 are respectively attached onto the side wall 1111 and the lapping edge 1113 of the frame body 111 to ensure that the cover plate 12 is firmly connected to the support bracket 11.

In addition, in order to improve connection strength between the support bracket 11 and the cover plate 12, a mutually fitting concave-convex structure can be further provided between the support bracket 11 and the cover plate 12. For example, referring to FIG. 7, the side edge 122 of the cover plate 12 is provided with a protrusion 1221 protruding toward the side wall 1111 of the support bracket 11, and the side wall 1111 of the support bracket 11 is provided with a pit 1111a. After the cover plate 12 is assembled onto the support bracket 11, the protrusion 1221 on the cover plate 12 is recessed into the pit 1111a on the support bracket 11. The cover plate 12 can be firmly installed on the support bracket 11 by a mutually limiting action between the protrusion 1221 on the cover plate 12 and the pit 1111a on the support bracket 11.

The pit 1111a on the support bracket 11 may be a recessed region, and the protrusion 1221 and the pit 1111a may increase the contact area between the cover plate 12 and the support bracket 11, increasing a welded area and welding strength between the cover plate 12 and the support bracket 11. Alternatively, the pit 1111a on the support bracket 11 may be a through hole, and the protrusion 1221 on the cover plate 12 is clamped into the through hole on the support bracket 11.

It can be understood that the support bracket 11 has a protrusion facing the cover plate 12, the cover plate 12 has a recessed region facing the support bracket 11, the protrusion and the recessed region are positioned opposite each other, and the cover plate can be limited when being installed on the support bracket, improving strength of the installation.

Referring to FIG. 7, because the support bracket 11 is a frame structure, a shape of the cover plate 12 matches a shape of the frame body 111 of the support bracket 11, and the edge of the plate body 121 of the cover plate 12 has a corner with which an extension direction is suddenly changed. For example, the cover plate 12 is formed by punching. In order to facilitate the forming of the cover plate 12, the side edge 122 can be provided only in a region located in a flat section on the outer edge of the plate body 121, and a corner of the plate body 121 is not provided with the side edge 122.

Because the plate body 121 of the cover plate 12 covers the entire region inside the frame body 111 of the support bracket 11, the area of the plate body 121 of the cover plate 12 is large, and the cover plate 12 is typically thin and has limited rigidity, a region on the cover plate 12 leaving the edge part is prone to collapse due to weight of the cover plate 12. In this regard, referring to FIG. 8, the support bracket 11 is typically further provided with a support plate 112, where the support plate 112 is located inside the frame body 111 of the support bracket 11, at least one of the two ends of the support plate 112 is connected to the lapping edge 1113 of the frame body 111, the support plate 112 and the lapping edge 1113 is on a same plane, the support plate 112 is attached onto the inner surface of the cover plate 12 to support the cover plate 12, preventing a partial region of the cover plate 12 from collapsing, and improving stability of the cover plate 12.

According to an actual size of the shielding case 1, a support plate 112 can be provided on the support bracket 11. For example, the support plate 112 is located in a central region of the cover plate 12 to steadily support both sides of the cover plate 12, so that regions on both sides of the cover plate 12 are kept horizontal. Alternatively, for a shielding case 1 with a large size, a plurality of support plates 112 may be spaced apart inside the frame body 111 of the support bracket 11, and the plurality of support plates 112 may be provided in different regions of the cover plate 12 correspondingly. This is not limited in this embodiment.

For example, the support plate 112 may be located in a region where a layout density of the elements 3 is low, and the gaps between the elements 3 in this region are large, so as to facilitate providing of the support plate 112, where the support plate 112 may be located in a gap between adjacent elements 3. In addition, the support plate 112 can be provided in a region where the cover plate 12 is prone to collapse, so that the support plate 112 can effectively support.

The support plate 112 on the support bracket 11 has no limitation on specific shape and size in this embodiment. For example, both ends of the support plate 112 are connected to the lapping edge 1113 of the frame body 111. The support plate 112 may be of a flat plate structure. Taking the support plate 112 with one end connected to the lapping edge 1113 of the frame body 111 shown in FIG. 9 as an example, the other end of the support plate 112 may form a bent supporting part 1121 facing the element surface 21 of the circuit board 2, the supporting part 1121 abuts on the element surface 21 of the circuit board 2, and the supporting part 1121 may be located, for example, in the gap between two adjacent elements 3.

Referring to FIG. 9, in an implementation that provides a reinforcing part 10a on the case body 10, the reinforcing part 10a on the case body 10 may be a support plate 112 provided on the support bracket 11, that is, the support bracket 11 has a support plate 112 located in the usable space above the step surface 311 of the first component 31. The support plate 112 is provided on a part corresponding to the step surface 311 of the first component 31 on the support bracket 11, so that the usable space between the step surface 311 of the first component 31 and the cover plate 12 is effectively utilized, and the support plate 112 provided on this part supports under the cover plate 12. The supporting force of the support plate 112 to the cover plate 12 prevents the cover plate 12 from collapsing, improves stability of the cover plate 12, and enhances reliability of the shielding case 1.

As described above, with reference to FIG. 7, for the first component 31 with the large planar size, due to a small gap between the surface of the first component 31 and the cover plate 12, the support plate 112 cannot be provided in a region where a surface of the first component 31 is located. The support plate 112 is provided in the usable space between the step surface 311 at an edge of the first component 31 and the cover plate 12, so that the supporting force of the support plate 112 to the corresponding part of the cover plate 12 may be spread to a region around this part of the cover plate 12, and the region around the part of the cover plate 12 that is supported by the support plate 112 does not collapse, thereby improving stability of the region of the cover plate 12 corresponding to the surface of the first component 31, preventing a partial region on the cover plate 12 above the first component 31 from collapsing to affect performance of the first component 31.

The support plate 112 serves as the reinforcing part 10a, where at least partial structure of the reinforcing part 10a is located in the usable space formed between a place right above the step surface 311 of the first component 31 and the cover plate 12. For example, the first component 31 is a stacked chipset. The support plate 112 is located above the step surface 311 formed between a lower chip and an upper chip located in the stacked chipset, that is, the support plate 112 is located above the lower chip, and the support plate 112 is located on a lateral side of an uppermost chip. For example, the first component 31 is an element 3 with an umbonate shape. The support plate 112 is located above the step surface 311 of the element 3, and the support plate 112 is located on a lateral side of a smaller-sized upper part of the element 3.

Still referring to FIG. 9, in order to avoid interference between the support plate 112 and the first component 31, a gap is present between the support plate 112 and a surface of the first component 31 close to the case body 10 in an extension direction of the circuit board 2, that is, a gap is present between the support plate 112 on the lateral side of the uppermost chip in the stacked chipset and an edge of the uppermost chip. Alternatively, a gap is present between the support plate 112 on the lateral side of the smaller-sized upper part of the element 3 with an umbonate shape and an edge of the upper part of the element 3. This facilitates the fitting of the support bracket 11 on the circuit board 2. The support plate 112 on the support bracket 11 corresponding to the step surface 311 of the first component 31 and the first component 31 do not affect each other, the support plate 112 of this part causes no damage to the first component 31, and correspondingly, the first component 31 will not affect stability of the support plate 112.

In an implementation, the support plate 112 serving as the reinforcing part 10a may extend along a length direction of the step surface 311 of the first component 31, so that the usable space formed between the step surface 311 of the edge part of the first component 31 and the cover plate 12 can be utilized, and a long support plate 112 can be provided above the step surface 311 at the edge of the first component 31, increasing the supporting force of the support plate 112 to the cover plate 12, improving the supporting effect of the support plate 112, improving steadiness of the cover plate 12, and enhancing reliability of the shielding case 1.

In order to utilize the usable space above the entire step surface 311 on the side of the first component 31, the support plate 112 extending along the length direction of the step surface 311 of the first component 31 (that is, extending along the edge of the first component 31) may cover at least the edge of the first component 31. Taking the support plate 112 located on one side of the first component 31 as an example, the support plate 112 covers, in its length direction, at least the entire lateral range on that side of the first component 31.

For example, referring to FIG. 9, FIG. 9 shows that the support plate 112 located on one side of the first component 31 covers the entire lateral range of that side of the first component 31. It can be understood that in a case that at least two sides of all circumferential sides of the first component 31 all have a step surface 311, for example, for a stacked chipset when four circumferential sides of the first component 31 all have a step surface 311, a support plate 112 may be provided on at least one side of the first component 31, or a support plate 112 may be provided on each of at least two sides of the first component 31. For example, a support plate 112 is provided on all circumferential sides of the first component 31 to improve utilization of the usable space formed between the step surfaces 311 of the first component 31 and the cover plate 12 and enhance the supporting force of the support plate 112 to the cover plate 12.

In addition, according to the layout design of the elements 3 around the first component 31, the support plate 112 extending along the edge of the first component 31 can extend to connect to both sides of the frame body 111, thereby extending the length of the support plate 112, improving strength and rigidity of the support bracket 11, increasing the supporting force of the support plate 112 to the cover plate 12, and improving strength and stability of the shielding case 1.

As described above, the support plate 112 may be located entirely in the usable space formed between the step surface 311 of the first component 31 and the directly opposite cover plate 12. Alternatively, partial structure of the support plate 112 is located in the usable space and the rest structure of the support plate 112 is located in the gap between the first component 31 and the adjacent element 3. In order to expand the coverage area of the support plate 112 and increase the supporting force of the support plate 112 to the cover plate 12, the support plate 112 may extend to a region beyond the usable space above the step surface 311.

Figure 10:
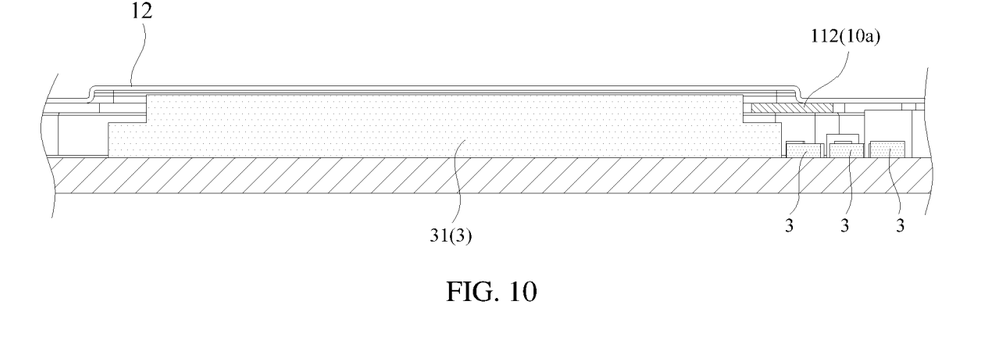
FIG. 10 is a schematic diagram of a partial cross section along A-A in FIG. 3.

FIG. 10 is a schematic diagram of a partial cross-section along A-A in FIG. 3.

Referring to FIG. 10, specifically, for example, the support plate 112 extends in a length direction of the step surface 311. In a width direction of the step surface 311, a projection of the support plate 112 on the circuit board 2 is partly located in a region covered by the step surface 311, that is, part of a width region of the support plate 112 is located above the step surface 311 of the first component 31, and another part of the width region of the support plate 112 extends to a lateral region of the first component 31. In this way, the width of the support plate 112 is increased, and the area of the support plate 112 is expanded, which may enhance the supporting force of the support plate 112 to the cover plate 12.

Still referring to FIG. 10, in actual application, if thickness of the element 3 provided adjacent to the first component 31 is less than thickness of the first component 31, and the space formed between the element 3 adjacent to the first component 31 and the cover plate 12 is large, the support plate 112 located above the step surface 311 of the first component 31 may extend above the element 3 adjacent to the first component 31, that is, the projection of the support plate 112 on the circuit board 2 is partly located in the region covered by the element 3 adjacent to the first component 31.

With reference to FIG. 9, in the width direction of the support plate 112, the support plate 112 extends to cover the space above the element 3 on the lateral side of the first component 31, so that the space formed between the element 3 on the lateral side of the first component 31 and the cover plate 12 is also utilized, increasing the width of the support plate 112, expanding the area of the support plate 112, and increasing the supporting force of the support plate 112 to the cover plate 12.

In addition, with reference to FIG. 7 and FIG. 10, in a case that the thickness of the element 3 provided on the lateral side of the first component 31 is less than the thickness of the first component 31, in order to reduce the space occupied by the shielding case 1, the cover plate 12 can be designed, so that the region on the cover plate 12 corresponding to the first component 31 protrudes relative to its surrounding region in a direction facing away from the circuit board 2. The gap between the cover plate 12 and the element 3 around the first component 31 is reduced, and the space occupied by the shielding case 1 is reduced on a basis that a suitable gap is maintained between the first component 31 and the cover plate 12. The space freed up by the shielding case 1 can be used for arranging other components in the electronic device.

For a structure on the cover plate 12 in which the region corresponding to the first component 31 protrudes relative to its region area in a direction facing away from the circuit board 2, the cover plate 12 creates a height difference between parts corresponding to the step surface 311 of the first component 31 and the element 3 on the lateral side of the first component 31. The support plate 112 extends into the space above the element 3 on the side of the first component 31, for the support plate 112 that extends horizontally along the element surface 21 of the circuit board 2, part of the structure of the support plate 112 located above the step surface 311 of the first component 31 is overhung, and part of the structure of the support plate 112 located above the element 3 on the lateral side of the first component 31 is attached onto the inner surface of the cover plate 12.

Figure 11:
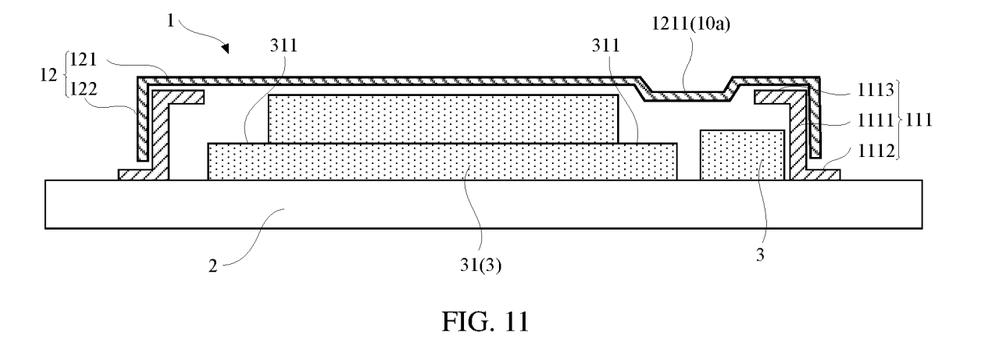
FIG. 11 is a schematic structural diagram of another circuit board assembly according to an embodiment of this application.

FIG. 11 is a schematic structural diagram of another circuit board assembly according to an embodiment of this application. FIG. 11 is another implementation that provides a reinforcing part 10a on the case body 10. The reinforcing part 10a on the case body 10 may be a recession 1211 provided on the cover plate 12, and the recession 1211 is located in the region on the cover plate 12 corresponding to the step surface 311 of the first component 31. The recession 1211 may be directly opposite the step surface 311 of the first component 31, and a projection of the recession 1211 on the circuit board 2 may be located entirely in the step surface 311 of the first component 31. Alternatively, part of a region of the recession 1211 is located in a region on the cover plate 12 directly opposite the step surface 311, and another part of the region of the recession 1211 is located in the gap between the first component 31 and the adjacent element 3.

The cover plate 12 is recessed toward the circuit board 2 in the region provided with the recession 1211, and the cover plate 12 is partially deformed in the region where the recession 1211 is located, changing a material extension direction of a region on the cover plate 12 corresponding to the region above the step surface 311 of the first component 31. The recession 1211 on the cover plate 12 exerts a force, opposite to a gravity direction of the cover plate 12, on a region around the recession 1211, supporting the region around the recession 1211 on the cover plate 12, improving stability of the region around the recession 1211, preventing the region around recession 1211 from collapsing, improving strength and stability of the cover plate 12, and enhancing reliability of the case body 10.

Similar to the foregoing support plate 112 on the support bracket 11, a gap should be present between the recession 1211 on the cover plate 12 and an edge of an upper side part of the first component 31 in an extension direction of a board surface of the circuit board 2 to prevent interference between the recession 1211 and the first component 31. In addition, the recession 1211 on the cover plate 12 may extend in a length direction of the step surface 311 of the first component 31, and the recession 1211 may cover at least the edge of the first component 31. In a width direction of the recession 1211, the recession 1211 may extend into a space on a lateral side of the first component 31. In a case that the thickness of the element 3 on the lateral side of the first component 31 is small, the recession 1211 may extend to cover the space above the element 3 on the lateral side of the first component 31. Details are not described herein.

For example, the recession 1211 may be a continuous groove structure on the cover plate 12 extending in the length direction of the step surface 311. Alternatively, the recession 1211 may be a plurality of pit structures spaced apart in the length direction of the step surface 311. In a case that all circumferential sides of the first component 31 have a step surface 311, the recession 1211 provided on the cover plate 12 corresponds to at least one side of the first component 31. For example, the recession 1211 is provided on a part on the cover plate 12 corresponding to each circumferential side of the first component 31. The recession 1211 may form an annular groove structure. Alternatively, the recession 1211 may be a plurality of pit structures spaced apart and enclosing in an annular shape.

It should be understood that in a case that a recession 1211 is provided on the cover plate 12 as a reinforcing part 10a, the cover plate 12 and the support bracket 11 can be processed and formed separately, and the cover plate 12 is connected to the support bracket 11 to form the case body 10, Alternatively, the cover plate 12 and the support bracket 11 can be an integrally formed structure. For example, the case body 10 is an integrally formed member, and the reinforcing part 10a is formed on the case body 10 by processing the recession 1211 in the region on the case body 10 corresponding to the step surface 311 of the first component 31. For example, the reinforcing part 10a can be formed on the case body 10 by punching.

In the descriptions of the embodiments of this application, it should be noted that unless otherwise specified and defined explicitly, the terms "mount", "connect", and "join" should be understood in their general senses. For example, they may refer to a fixed connection, an indirect connection via an intermediate medium, an internal communication between two elements, or an interaction between two elements. Persons of ordinary skill in the art can understand specific meanings of these terms in the embodiments of this application based on specific situations.

In the specification of the embodiments, the claims, and the accompanying drawings of this application, the terms "first", "second", "third", "fourth", and so on (if existent) are intended to distinguish between similar objects but do not necessarily indicate a specific order or sequence.

What is claimed is:

1. A circuit board assembly, comprising: a circuit board with a plurality of elements provided on a side surface of the circuit board; and a shielding case installed on the side surface of the circuit board and capping at least part of the plurality of elements; wherein the shielding case comprises a case body provided on the circuit board; wherein the case body and the circuit board enclose a shielded region, one or more of the plurality of elements are located in the shielded region, the one or more elements in the shielded region comprise at least one first component, and the at least one first component comprises a step surface facing the case body; and wherein a reinforcing part is provided on the case body, the reinforcing part is at least partly located in a region on the case body facing to the step surface, and wherein the reinforcing part extends in a length direction of the step surface and covers at least an edge of the at least one first component.

2. The circuit board assembly of claim 1, wherein the case body comprises a support bracket and a cover plate; and wherein the support bracket provides support on the circuit board and the cover plate caps the support bracket.

3. The circuit board assembly of claim 2, wherein the support bracket comprises a frame body and at least one support plate; and wherein the frame body is provided around an edge of the shielded region, the at least one support plate fits inside the frame body, and the at least one support plate forms the reinforcing part.

4. The circuit board assembly of claim 2, wherein the cover plate is provided with a recession; and wherein the recession is recessed from another surface of the cover plate towards the step surface and forms the reinforcing part.

5. The circuit board assembly of claim 1, wherein in an extension direction of a board surface of the circuit board, a gap is present between the reinforcing part and a surface of the at least one first component closest to the case body.

6. The circuit board assembly of claim 1, wherein a projection of the reinforcing part on the circuit board is partly located in a region covered by the step surface.

7. The circuit board assembly of claim 6, wherein in a width direction of the step surface, thickness of an element provided adjacent to the at least one first component is less than thickness of the at least one first component; and wherein the projection of the reinforcing part on the circuit board is partly located in a region covered by the element adjacent to the at least one first component.

8. An electronic device, comprising at least one circuit board assembly; wherein the at least one circuit board assembly comprises: a circuit board with a plurality of elements provided on a side surface of the circuit board; and a shielding case installed on the side surface of the circuit board and capping at least part of the plurality of elements; wherein the shielding case comprises a case body provided on the circuit board; wherein the case body and the circuit board enclose a shielded region, one or more of the plurality of elements are located in the shielded region, the one or more elements in the shielded region comprise at least one first component, and the at least one first component comprises a step surface facing the case body; and wherein a reinforcing part is provided on the case body, the reinforcing part is at least partly located in a region on the case body facing to the step surface, and wherein the reinforcing part extends in a length direction of the step surface and covers at least an edge of the at least one first component.

9. The electronic device of claim 8, wherein the case body comprises a support bracket and a cover plate, and wherein the support bracket provides support on the circuit board and the cover plate caps the support bracket.

10. The electronic device of claim 9, wherein the support bracket comprises a frame body and at least one support plate, and wherein the frame body is provided around an edge of the shielded region, the at least one support plate fits inside the frame body, and the at least one support plate forms the reinforcing part.

11. The electronic device of claim 8, wherein in an extension direction of a board surface of the circuit board, a gap is present between the reinforcing part and a surface of the at least one first component closest to the case body.

12. The electronic device of claim 8, wherein a projection of the reinforcing part on the circuit board is partly located in a region covered by the step surface.

13. The electronic device of claim 12, wherein in a width direction of the step surface, a thickness of an element that is adjacent to the at least one first component is less than a thickness of the at least one first component, and wherein the projection of the reinforcing part on the circuit board is partly located in a region covered by the element that is adjacent to the at least one first component.

14. The electronic device of claim 10, wherein the frame body comprises a side wall, a fastening edge, and a lapping edge, the side wall provides support on the circuit board, the fastening edge and the lapping edge are located on two ends of the side wall respectively, the fastening edge is attached onto the circuit board, and the lapping edge is attached onto the cover plate.

15. The electronic device of claim 14, wherein the fastening edge is located outside a region enclosed by the side wall, the lapping edge is located inside the region enclosed by the side wall, and the support plate is connected to the lapping edge.

16. The electronic device of claim 8, wherein the side surface of the circuit board on which the elements are provided is an element surface of the circuit board, and the step surface is facing away from the element surface of the circuit board.

17. The circuit board assembly of claim 1, wherein the at least one first component is a stacked chipset comprising a first chip stacked on a second chip, and the first chip and the second chip define the step surface.

18. The electronic device of claim 8, wherein the at least one first component is a stacked chipset comprising a first chip stacked on a second chip, and the first chip and the second chip define the step surface.

* * * * *